United States Patent [19]

Mears et al.

[11] Patent Number: 4,817,556

[45] Date of Patent: Apr. 4, 1989

[54] APPARATUS FOR RETAINING WAFERS

[75] Inventors: Eric L. Mears, Rockport; Richard J. Hertel, Bradford; Robert V. Brick, Gloucester; Carl J. Holt, Jr., Newport, all of Mass.

[73] Assignee: Varian Associates, Inc., Palo Alto, Calif.

[21] Appl. No.: 46,230

[22] Filed: May 4, 1987

[51] Int. Cl.$^4$ ............................................. B05C 13/00
[52] U.S. Cl. .................................... 118/503; 118/730; 269/238; 269/254 R; 279/1 D
[58] Field of Search ............... 118/503, 728, 729, 730; 279/1 D, 35, 106, 1 G; 414/217; 269/238, 254 R, 239

[56] References Cited

U.S. PATENT DOCUMENTS

| | | |
|---|---|---|
| 2,337,329 | 12/1943 | Hewlett . |
| 2,448,881 | 9/1948 | Glynn ............................ 279/106 |
| 2,686,681 | 8/1954 | Nyland ........................... 279/1 D |
| 2,864,332 | 12/1958 | Woolley . |
| 2,865,643 | 12/1958 | Parker et al. . |
| 3,159,395 | 12/1964 | Mussett et al. . |
| 3,191,952 | 6/1965 | Morawski ....................... 279/1 G |
| 3,340,176 | 9/1967 | Belluso et al. . |
| 3,566,960 | 3/1971 | Stuart . |
| 3,598,083 | 8/1971 | Dort et al. .................... 118/503 X |
| 3,625,384 | 12/1971 | Boerger et al. ................. 214/306 |
| 3,645,581 | 2/1972 | Lasch, Jr. et al. . |
| 3,700,250 | 10/1972 | Bautz .............................. 279/35 |
| 3,721,210 | 3/1973 | Helms et al. . |
| 3,874,525 | 4/1975 | Hassan et al. . |
| 3,921,572 | 11/1975 | Brunner et al. ................. 118/730 |
| 3,977,955 | 8/1976 | Nevis et al. ..................... 204/192 |
| 3,983,838 | 10/1976 | Christensen ..................... 118/500 |
| 4,068,814 | 1/1978 | Anthony et al. ................. 118/503 |
| 4,094,722 | 6/1978 | Yamamoto et al. .............. 156/345 |
| 4,228,358 | 10/1980 | Ryding .......................... 250/457 |
| 4,261,762 | 4/1981 | King ............................. 118/728 X |
| 4,282,924 | 8/1981 | Faretra .......................... 118/500 |
| 4,306,731 | 12/1981 | Shaw ............................. 279/4 |
| 4,311,427 | 1/1982 | Coad et al. ..................... 414/217 |
| 4,313,266 | 2/1982 | Tam .............................. 34/8 |
| 4,447,049 | 5/1984 | Rudy ............................. 269/296 X |
| 4,473,455 | 9/1984 | Dean et al. ..................... 118/503 X |
| 4,530,635 | 7/1985 | Engelbrecht et al. ............ 414/627 |
| 4,553,069 | 11/1985 | Purser ........................... 414/225 X |
| 4,565,601 | 1/1986 | Kakehi et al. ................... 156/643 |
| 4,584,045 | 4/1986 | Richards ........................ 414/217 X |
| 4,647,266 | 3/1987 | Coad et al. ..................... 414/225 |
| 4,669,226 | 6/1987 | Mandler ......................... 279/1 D X |

FOREIGN PATENT DOCUMENTS

| | | | |
|---|---|---|---|
| 0178803 | 4/1986 | European Pat. Off. . | |
| 0079724 | 5/1985 | Japan ............................. | 118/730 |
| 0864381 | 9/1981 | U.S.S.R. ........................ | 269/254 R |

OTHER PUBLICATIONS

R. H. Brunner, "Wafer Chuck"; *IBM Technical Disclosure Bulletin*, vol. 17, No. 1, (Jun. 1974), p. 84.

Primary Examiner—Shrive Beck
Assistant Examiner—Alain Bashore
Attorney, Agent, or Firm—Stanley Z. Cole; Gerald M. Fisher; Terrence E. Dooher

[57] ABSTRACT

A device for releaseably holding a workpiece includes a resilient collet which is pivotally attached to a base. Several fingers for holding the workpiece extend from the collet. The fingers are pivoted by actuating a member which elastically deforms the collet and causes the fingers to pivot from a position for engaging the workpiece to a position for releasing the workpiece and vice-versa. In one application, the base is a platen for supporting a wafer in a semiconductor processing system and a plurality of such platens and a corresponding plurality of the holding devices are arranged around the periphery of the disk. A counterweight ring is attached to the ring-shaped collet to counter-balance the moment generated by the centrifugal force of the wafer pressing against the fingers as the disk is rotated.

26 Claims, 6 Drawing Sheets

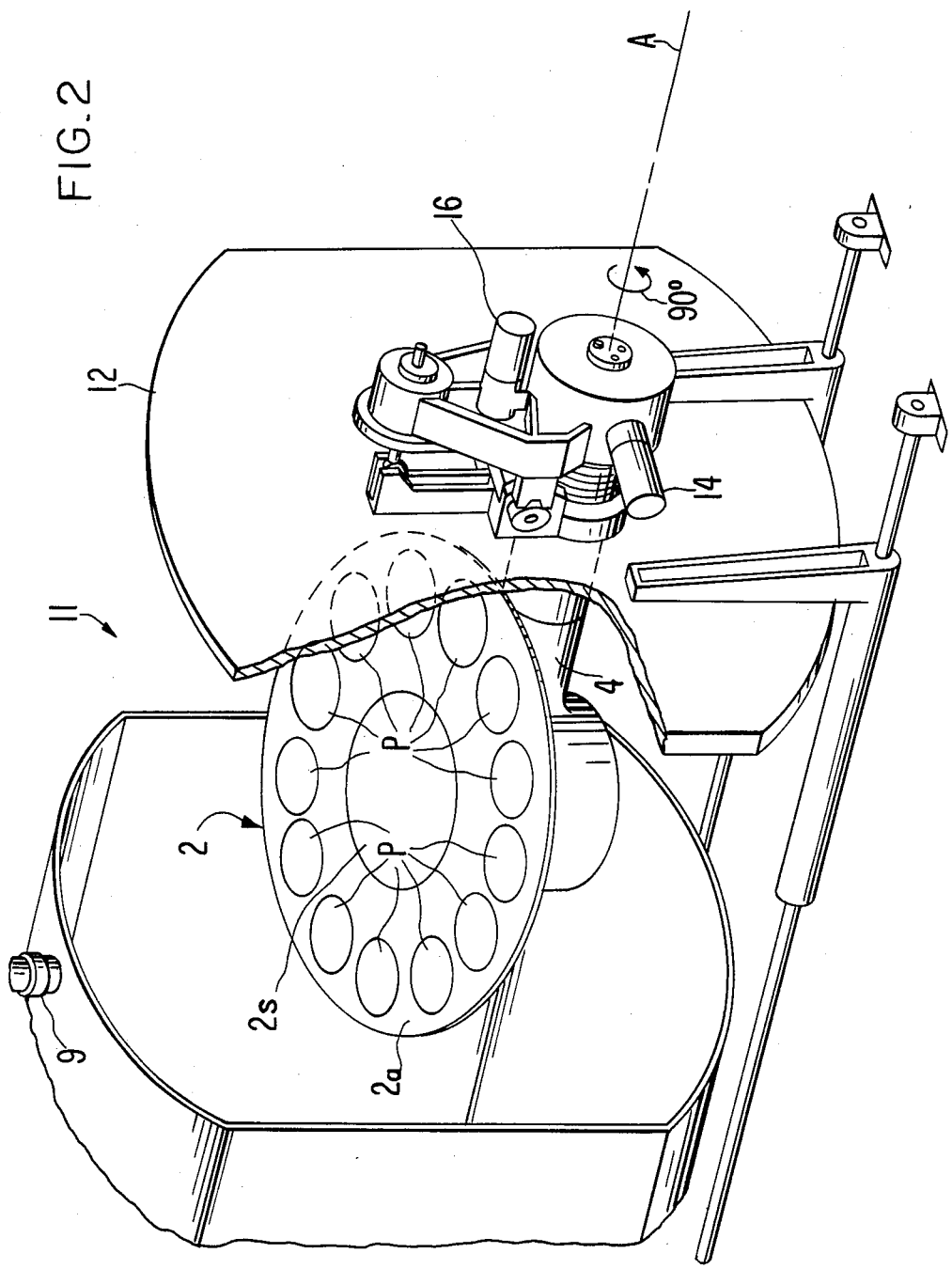

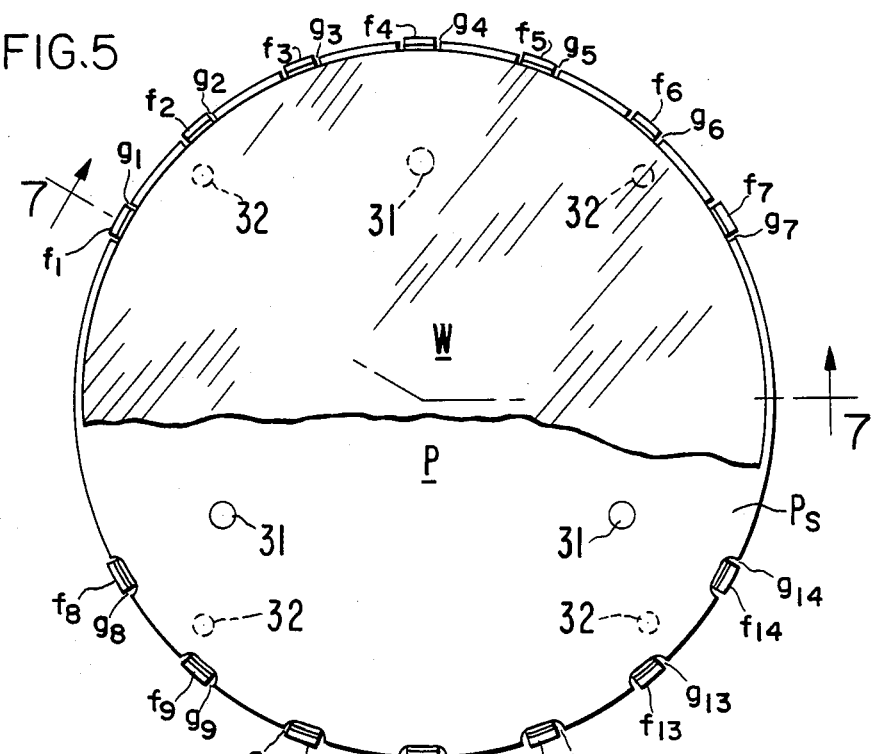
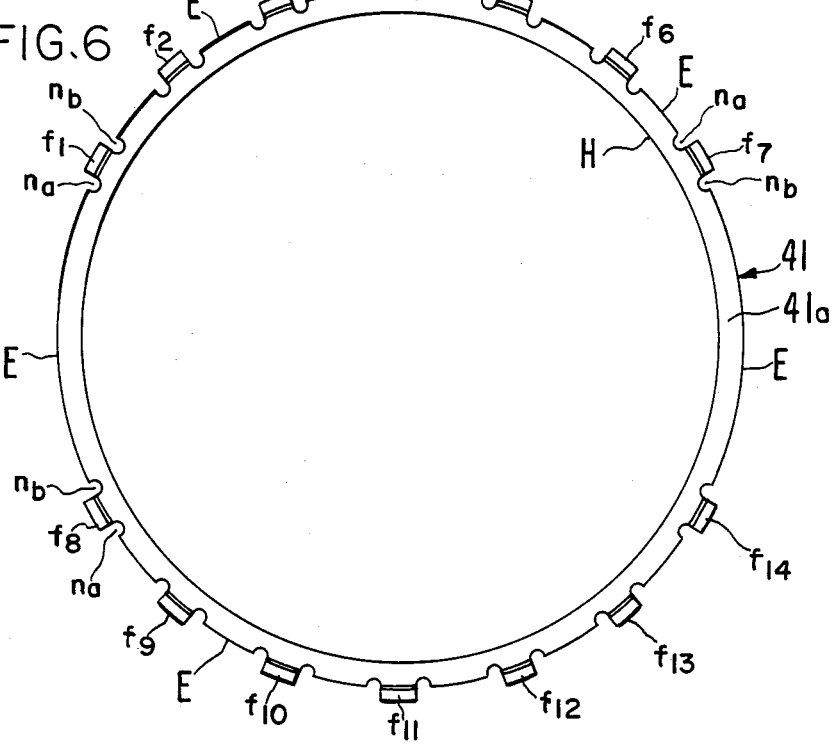

APPARATUS FOR RETAINING WAFERS

BACKGROUND OF THE INVENTION

This invention relates to an apparatus for accepting, retaining and releasing a workpiece, and in particular, to an apparatus for accepting, retaining and releasing a wafer in a semiconductor processing system.

Prior art devices for holding wafers during processing include a spring-loaded clamping ring as shown, for example, in Faretra, U.S. Pat. No. 4,282,924 and commonly assigned to the assignee of the present invention. This clamping apparatus has the disadvantage that the clamping ring presses against the surface of the semiconductor wafer being held in position by the clamping apparatus, thus wasting valuable silicon surface area which is not available for processing. Since such a clamping ring is proud of the wafer surface, sputter contamination of the surface of the wafer during ion implantation may result from energetic ions striking the clamping ring. Further, the sliding surfaces and rubbing springs of such devices tend to generate particles which may contaminate the wafer surface.

In commercially available batch processing ion implantation systems (from, e.g., Eaton, Inc. and Applied Materials, Inc.), a plurality of platens are arranged concentrically around the periphery of a disk and wafers held on the platens are implanted as the disk rotates. In these systems, the devices used to hold wafers on the platens against the centrifugal force generated by the rotation of the disk include an arcuate bumper on the outer edge of each platen and a spring-driven mechanism to slide the wafers against the bumper. The sliding of a wafer across the platen tends to generate particles on the lower surface of the wafer which impedes thermal contact between the wafer and the platen and which may be transported to contaminate the wafer surface.

The wafer-holding apparatus of the present invention avoids these negative features of prior art holding devices.

SUMMARY OF THE INVENTION

A device for releaseably holding a workpiece is disclosed which includes a base, a resilient member attached to the base having a plurality of finger members, and means for moving the finger members to selectably engage or disengage the workpiece by elastically deforming the resilient member.

In one embodiment the finger members are attached to the base by means of a resilient collet having the shape of a closed loop. The collet is elastically deformed to pivot the finger members from a closed position for engaging and thus holding the workpiece to an open position for releasing the workpiece. In a particular embodiment, the base is a platen for holding a flat workpiece. When the fingers are in the open position, the workpiece may be placed on or removed from the platen without contacting the finger members. When the fingers are in the closed position, they do not contact the top planar surface of the flat workpiece, so that the entire top surface of the workpiece is available for processing.

In one embodiment, the finger members are an integral part of the resilient collet and the collet is attached to the platen by engaging an annular elastomeric ring fixed to the platen. In one preferred embodiment, the surface of the finger members proximate the central axis of the platen are inclined a few degrees with respect to the central axis and are dimensioned so that they do not extend above the surface of the workpiece.

The holding mechanism of the present invention is particularly useful in retaining the workpiece on the platen when the platen is part of a disk in a batch processing apparatus which rotates the disk at high speeds during processing of the workpiece. In such an embodiment, a counterweight is attached to the collet for the purpose of generating a moment equal and opposite to the moment generated by the workpiece pressing against the finger members.

The metallic surfaces of the moving parts of the device are separated by elastomers which practically eliminate generation of particulates.

The invention and its other advantages may be more fully understood by reference to the drawings and accompanying detailed description of the invention.

BRIEF DESCRIPTION OF THE DRAWINGS

FIG. 2 shows a partial cut-away perspective view of an implant chamber.

FIG. 5 shows a top view of a platen P and the wafer-retaining apparatus of the present invention.

FIG. 6 shows a top view of the collet connecting the fingers shown in FIG. 5.

DETAILED DESCRIPTION OF THE INVENTION

Figure 1:
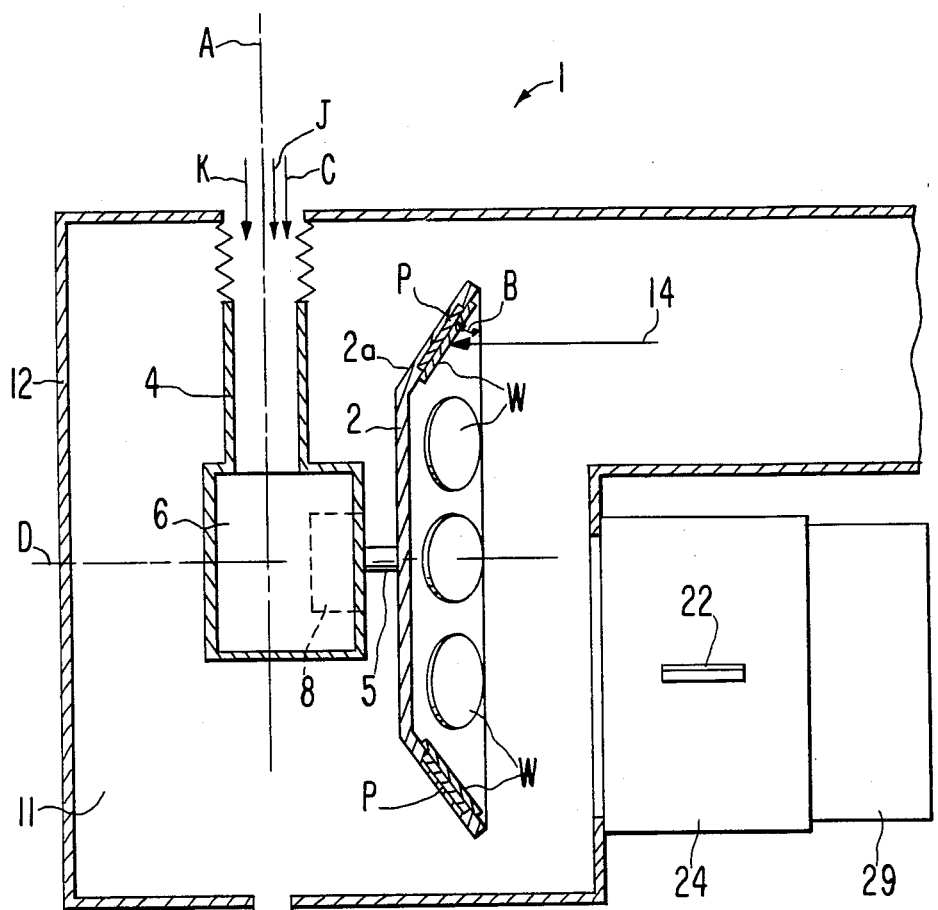
FIG. 1 shows a simplified schematic cross-sectional diagram of an end station for a batch processing ion implantation system.

FIG. 1 shows a simplified schematic cross-sectional diagram of an end station 1 for a batch processing ion implantation system which employs the wafer-holding device (not shown in FIG. 1) of the present invention. End station 1 includes a rotatable disk 2 mounted at its center to drive shaft 5 of spin drive motor 6 which rotates drive shaft 5 about its spin axis D. Spin drive motor 6 and drive shaft 5 are contained in housing 4 which extends through housing 12 to the exterior of vacuum chamber 11. Power line C provides external electric power to spin drive motor 6. Disk 2 is shown in its generally vertical implant orientation in FIG. 1. Disk 2 includes a peripheral conical ring 2a having a selected small base angle B, for example 7°. A plurality of semiconductor wafers W are retained on a corresponding plurality of platens P mounted on ring 2a by the wafer-holding device of the present invention. The surface of each platen P is flat and each platen is partially recessed in ring 2a and attached thereto. As explained below, during operation of the system, each wafer W is forced against its corresponding platen on peripheral conical ring 2a by the component of centrifugal force normal to the surface of the wafer generated by rotation of disk 2 on drive shaft 5.

If desired, drive shaft 5 may include a rotary vacuum feedthrough 8. Fluid lines J and K extend from outside vacuum chamber 11 via housing 4 to rotary feedthrough 8. A first fluid, typically water, for cooling the platens P flows from fluid line J through feedthrough 8 to channels (not shown) in disk 2 which extend from vacuum feedthrough 8 to the platens P. Fluid line K provides a second selected fluid, typically gas, via feedthrough 8 to other channels (not shown) in disk 2 and platens P which carry the selected gas to the back surface of wafers W which are held against platens P. The gas provided between a platen P and a wafer W enhances the cooling of wafer W when wafer W is subjected to the heat caused by the impact of ion beam 14 on the surface of wafer W. Ion beam 14 is formed in an ion source (not shown) and is passed through appropriate mass analysis and ion optical elements (not shown) before being applied to wafers W. Vacuum pump 7 is coupled through isolation valve 9 to vacuum implant chamber 11 defined by housing 12. Vacuum pump 7 serves to evacuate vacuum chamber 11 prior to implantation of wafers W.

FIG. 2 shows a partial cut-away perspective view of implant chamber 11 with disk 2 in horizontal position. Disk 2 is rotated about axis A by flip drive motor 14 and associated linkage (not shown) from the position shown in FIG. 2 to the implant position shown in FIG. 1. Scan drive motor 16 and associated linkage (not shown) reciprocate disk 2 in a plane approximately perpendicular to ion beam 14 when disk 2 is oriented for implantation as shown in FIG. 1. Motors 14 and 16 are mounted exteriorly of chamber 11.

In operation, a wafer in loadlock 29 (FIG. 1) is conveyed to a selected platen P on disk 2a by means of transfer arm 22 located in transfer chamber 24 as is explained in more detail in connection with FIG. 3.

Figure 3:
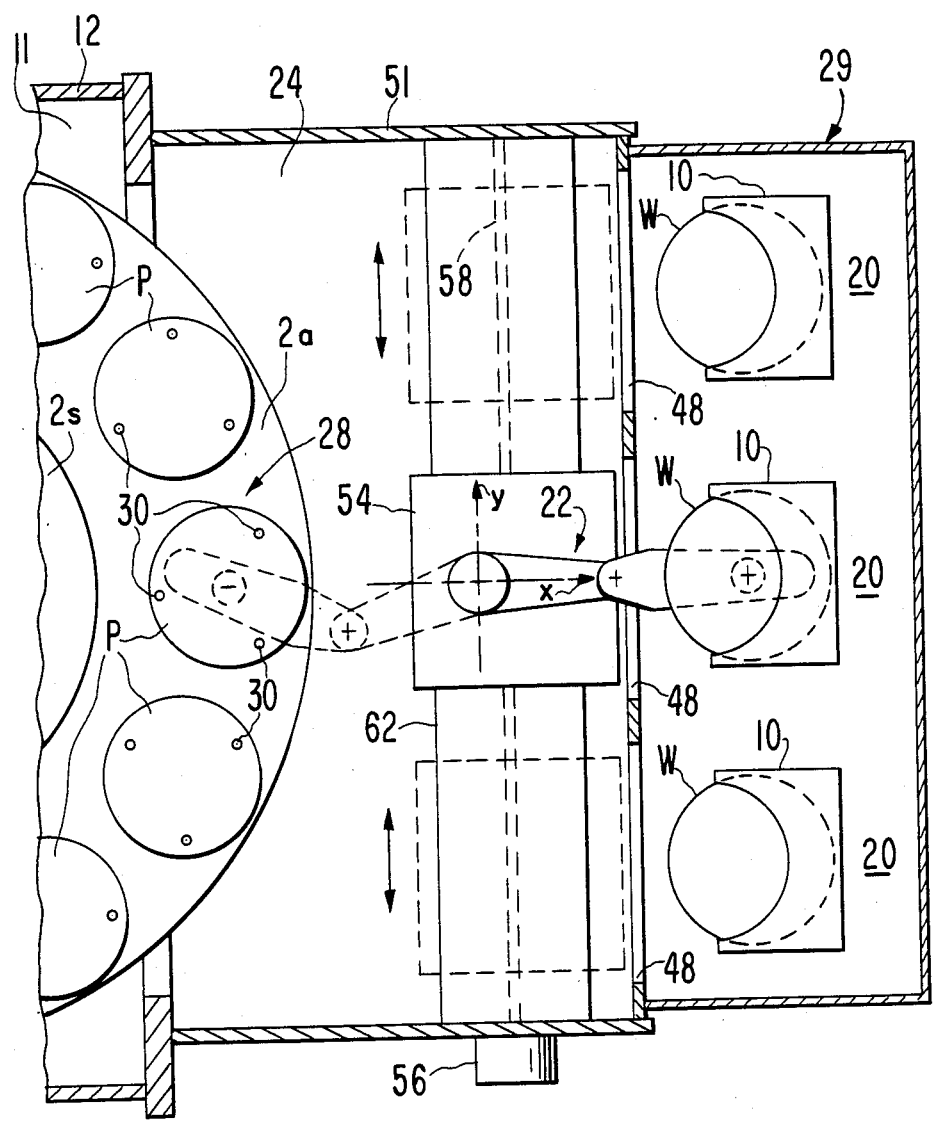
FIG. 3 shows a partially cut-away view of a transfer chamber for the implant chamber of FIG. 2.

FIG. 3 shows a partially schematic plan view of transfer chamber 24 and elevator chamber 20 of loadlock 29. Cassettes 10 holding wafers W are placed in elevator chamber 20 of loadlock 29 via loading chambers not shown in FIG. 2 and which are not pertinent to the present invention. The details of loadlock 29 are provided in copending U.S. patent application Ser. No. 856,814, (abandoned 12-21-87), entitled "Wafer Transfer System", assigned to the assignee of the present invention which is incorporated herein by reference. Wafers W are removed from a selected cassette holder 10 one at a time by wafer transfer arm 22.

Transfer vacuum chamber 24 opens off implant chamber 11 and is defined by housing 51. Chamber 24 is connected to a vacuum pumping system (not shown) for evacuation thereof. Transfer arm 22 is located in chamber 24 and is supported and operated by a transfer drive system which includes a drive assembly 54 which supports and drives transfer arm 22. Drive assembly 54 and arm 22 attached thereto are laterally moveable along the Y axis shown in FIG. 1. Drive assembly 54 is moveable along the Y axis under the control of drive motor 56 positioned outside chamber 24 and a lead screw 58 so that drive assembly 54 and arm 22 mounted thereon can be positioned opposite a selected cassette 10. Additional details concerning the operation of transfer arm 22 are provided in the above-referenced copending U.S. Patent Application. Once positioned opposite a selected cassette, transfer arm 22 is extended through opening 48 into cassette 10 beneath a selected wafer and then cassette 10 is lowered by an elevator mechanism (not shown) a selected distance so that the selected wafer is transferred to transfer arm 22. Transfer arm 22 is then withdrawn from cassette 10.

In order to transfer the wafer W on arm 22 to a selected platen P on conical ring 2a, disk 2 is rotated about axis A and about axis D so that the selected platen P is horizontal and located above wafer-loading station 28. Arm 22 with the wafer W thereon is then extended over the selected platen.

Figure 4:
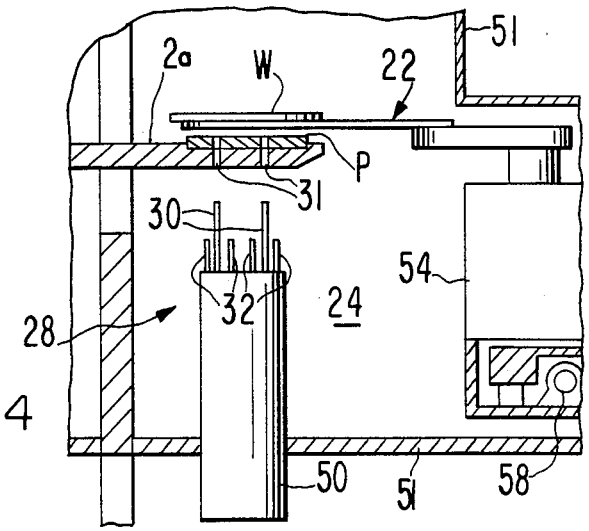
FIG. 4 shows a side view of the wafer loading station in the transfer chamber of FIG. 3.

FIG. 4 shows a side view of wafer-loading station 28 with a selected platen P having been rotated on ring 2a above station 28. Arm 22 is shown extended above the selected platen P with wafer W resting thereon. During wafer-loading and unloading, disk 2 is incrementally rotated about axis D so that each wafer platen located on annular ring 2a is presented to wafer transfer location 28.

Lift pins 30, typically 3 in number, are selectably moved upwardly and downwardly by actuating air cylinder 50 through holes 31 in wafer support platen P on disk 2. Pins 30 lift a wafer from a platen surface for removal by arm 22 or lift a wafer from transfer arm 22 for placement on platen surface P. When a wafer is being loaded onto a platen P positioned above station 28, pins 30 are extended through cylindrical holes 31 which extend through conical ring 2a and platen P until they contact wafer W carried by arm 22 and then are extended a small distance further so that wafer W is lifted from transfer arm 22 which is then retracted by drive mechanism 54. When a wafer is being removed from the disk, it is first lifted by pins 30. Next, transfer arm 22 is extended between wafer W and platen P and lift pins 30 are then lowered through cylindrical holes 31, thereby lowering wafer W onto transfer arm 22.

Wafer W is retained on platen P by the mechanism described in connection with FIG. 5 through FIG. 8.

FIG. 5 shows a top view of platen P with retaining fingers $f_1$ through $f_{14}$, which when attached thereto as explained below, extend slightly above the flat surface Ps of platen P. In one embodiment, the fingers $f_1$ through $f_{14}$ are dimensioned to extend above surface Ps by only the thickness of the wafer to be retained by the fingers, so that they do not extend above the surface of a wafer being retained. The inside faces of fingers $f_1$ through $f_{14}$ are machined to conform to the shape of the edge of the workpiece, in particular, in FIG. 5, they form portions of a circle to match the circumference of the circular wafer. Platen P includes holes 31 for pins 30 (FIG. 4) which lower a wafer to platen P (and which lift a wafer from platen P). Grooves $g_1$ through $g_{14}$ are machined in aluminum platen P and dimensioned to accommodate the corresponding fingers $f_1$ through $f_{14}$. The number of fingers need not be 14, but it is preferable to employ at least 3 fingers and preferable to employ more than 3 fingers to accommodate variations in the geometry of the workpiece. For example, if a wafer has one or more flats, typically a finger will not make contact with the flat portion of the wafer W held on platen P.

As shown in FIG. 6, circular collet 41 comprises a thin, resilient generally annular ring portion 41a connecting fingers $f_1$ through $f_{14}$. In this embodiment, finger members $f_1$ through $f_{14}$ are an integral part of collet 41 which is machined from a single piece of aluminum or other suitable material. The pair of notches $N_a$, $N_b$ in collet 41 on each side of each finger are not essential to the operation of the collet, but serve to reduce stress in the region where a finger joins the resilient portion 41a of collet 41. Resilient portion 41a is actually conical in shape in that inner edge H is lower than outer edge E (see angle $\alpha$ in FIG. 8).

Figure 7:
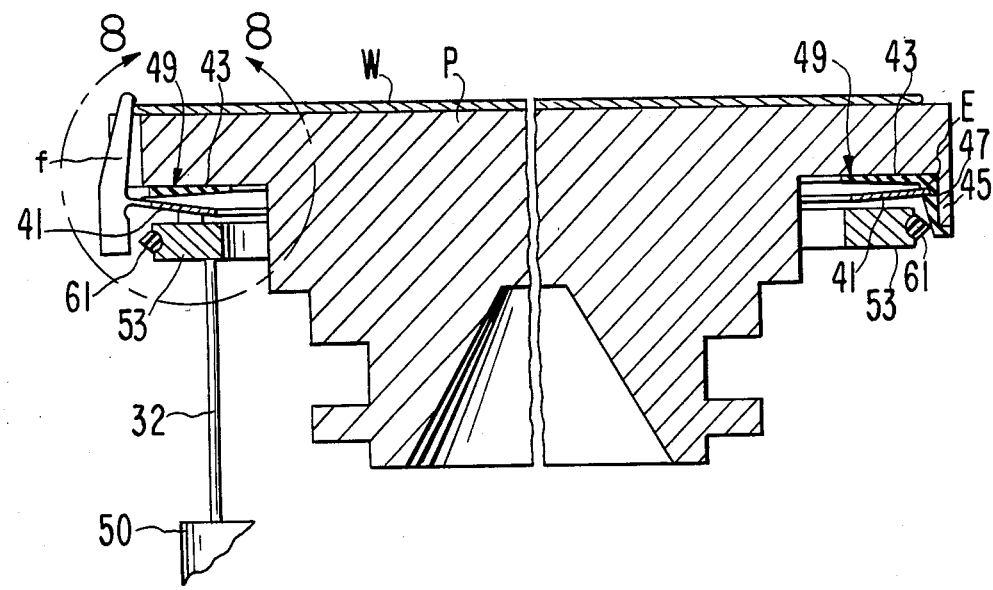
FIG. 7 shows a cross-sectional view along the line 7.7 of FIG. 5.
Figure 8:
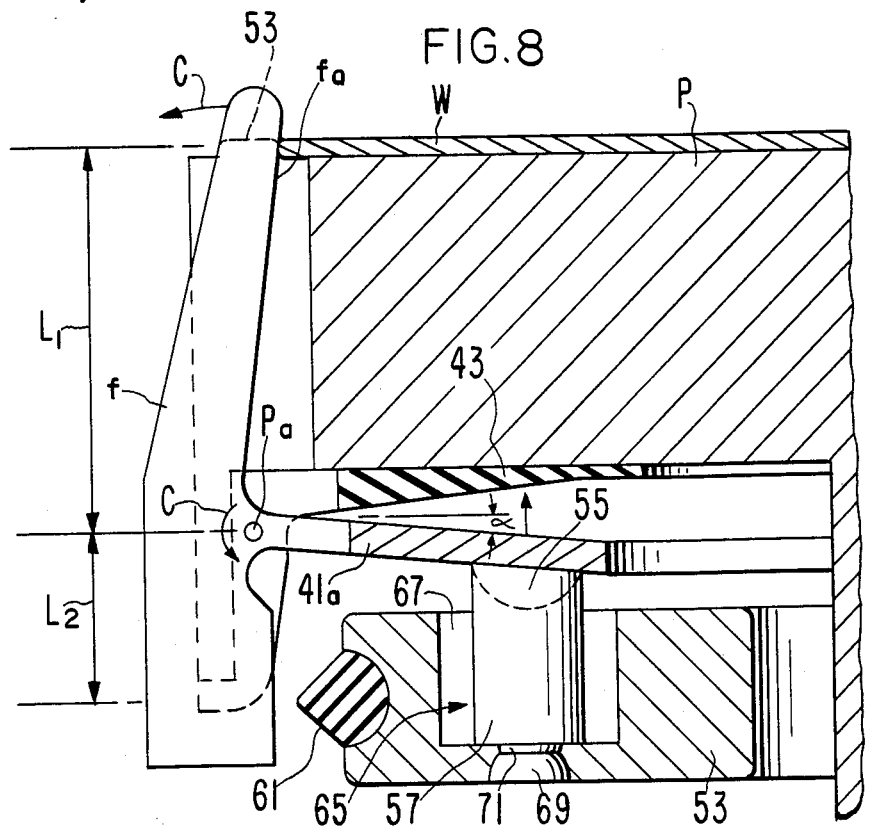
FIG. 8 shows an expanded scale cross-sectional view of region A of FIG. 7.

FIG. 7 shows a cross-section of platen P and the attached collet 41 of FIG. 5 along the line 7.7. FIG. 8 shows an enlarged view of the region 8—8 of the cross-section in FIG. 7. As shown in FIG. 7, annular groove 49 is machined into the base of platen P near the periphery of platen P so that skirt sections 45 of the platen are formed between the grooves $g_1$ through $g_{14}$ shown in FIG. 5. An annular elastomer 43 is molded to the top surface of annular groove 49 and to the inside surface of arc-like skirt sections 45 of platen P. sections 47 are molded into elastomer 43 near the top portion of elastomer 43 on the inside skirt sections 45. Collet 41 is attached to platen P (FIG. 7) by snapping the edge portions E (only a few of which are labeled in FIG. 6 for the sake of clarity) between fingers $f_1$ through $f_{14}$ into grooves 47. Thus, there is no metal on metal contact of collet 41 and platen P.

When collet 41 has been snapped into place, the fingers $f_1$ through $f_{14}$ are located in grooves $g_1$ through $g_{14}$ as shown in FIG. 5. FIG. 8 shows the mechanism for moving a typical finger f from a closed position (shown in FIG. 8) for contacting and holding wafer W on platen P to an open position (not shown) wherein finger f does not contact wafer W.

Annular counterweight ring 53 is attached to the underside of collet 41 by means of elastomeric annular ring 55 which is molded on collet 41. Ring 55 has a generally semicircular cross-section, as shown in FIG. 8, except that at selected locations around ring 55 molded finger like projections 57 of the elastomer of ring 55 extend downward through circular holes 65 through counterweight ring 53. Circular hole 65 has a top portion 67 of larger diameter than the bottom portion 69 with a narrow neck portion 71 inbetween top portion 67 and bottom portion 69. Counterweight ring 53 is attached to collet 41 by pulling the elastomeric projections 52 through the narrow neck portions 71 and then trimming the projections to be flush with the bottom of counterweight ring 53 as shown in FIG. 8. The thin resilient connecting ring portion 41a of collet 41, which is angled (by $\alpha$ degrees) slightly downward from the horizontal, acts as a spring element biasing the fingers $f_1$ through $f_{14}$ inward to the closed position for engaging a wafer shown in FIG. 8. In one embodiment $\alpha$ is 5°.

In operation, the finger f is pivoted counterclockwise, as indicated by arrows C, about a virtual pivot arc $P_a$ to an open position for allowing the wafer W to be lowered onto platen P by prongs 30 (FIG. 4) or to be removed from platen P by prongs 30 without contacting finger f.

The pivoting of finger f to the open position is accomplished by air cylinder 50 (FIGS. 4 and 8), or other means, driving prongs 32 through openings (not shown) in ring 2a and against the bottom side of counterweight ring 53, which causes counterweight ring 53 to move upward, elastically deforming thin resilient portion 41a of collet 41 until it is stopped by pressing against elastomer 43. Deforming the spring portion 41a causes a type of "oil-can" action in the spring portion similar to the action of a Bellville spring washer which yields almost constant spring force over the full stroke range. Rate characteristics may be selected by selecting the geometry of the collet. This elastic deformation causes finger f to pivot about virtual pivot arc $P_a$. The edge E of collet 41 pressed into groove 47 in elastomer 43 acts as a pivot in a sensitive gravi-metric scale where finger f is the balance beam. The pivot arc $P_a$ is a virtual extension of groove 47

In operation, air cylinder 50 drives all four prongs 32 (FIG. 4) against ring 53 simultaneously. Since counterweight ring 53 is substantially more rigid than the resilient portion 41a of collet 41, the four actuating prongs 32, which are spaced 90° apart beneath counterweight ring 53, simultaneously pivot all of the fingers $f_1$ through $f_{14}$ when prongs 32 are driven against counterweight ring 53. When actuating prongs 32 are lowered by air cylinder 50, the elastically deformed resilient portion 41a elastically restores itself. Air cylinder 50 simultaneously drives actuating prongs 32 and lifting prongs 30. These prongs are dimensioned relative to platen P so that prongs 32 engage counterweight ring 53 to drive collet portion 41a against elastomeric stop 43 and thus pivot fingers $f_1$ through $f_{14}$ to the open position before lifting prongs 30 emerge above the top surface of platen P. Air cylinder 50 then continues to drive lifting prongs 30 above the top surface of platen P while actuating prongs 32 continue to press on counterweight ring 53 by means of spring compliance. The operation of air cylinder 50 is controlled by a controller (not shown).

In operation, when the implant system is in the implant orientation (FIG. 2), spin drive motor 6 typically spins disk 2 at a rate on the order of 1000 rev/min, which generates a centrifugal force having a component normal to the planar surface of wafer W and a component parallel to the planar surface of wafer W. In the operating environment described above, forces of approximately 500 g's are generated near the periphery of portion 2a of the spinning disk 2, and the fingers f must remain in the closed position even in this extreme environment.

The component normal to the surface of wafer W presses wafer W against platen P. The component parallel to the surface of wafer W causes wafer W to press outwardly against those fingers near the outer edge of portion 2a of disk 2. When wafer W presses outwardly against a selected finger f (FIG. 8), the force generated by the wafer has a lever arm of length $L_1$.

The counterweight ring 53 is subject to the same centrifugal forces as wafer W. The slender profile of aluminum counterweight 53 allows ring 53 to elastically deform under high g loads to an oval shape. Thus, as wafer W presses outward against finger f, the elastomeric interface 61 on counter-weight ring 53 also presses against finger f. Molded elastomeric ring 61 recessed in the outer edge of counterweight ring 53 provides a soft contact surface between counterweight ring 53 and finger f. The force exerted on finger f by elastomeric interface 61 has a lever arm of length $L_2$. The weight of counterweight ring 53 is selected so that the rotational moment about pivot arc $P_a$ generated by wafer W is approximately balanced by the opposing rotational moment generated by counterweight ring 53.

Finger f shown in FIG. 8 extends slightly above the surface of the wafer. In another embodiment the finger f is dimensioned so that it extends only to the top surface of wafer W. The phantom line 53 in FIG. 8 indicates the contour of a finger f which does not extend above the surface of wafer W. This contour is advantageous for reducing the sputter of the wafer surface caused by energetic ions striking fingers f.

It should also be noted that inside face, $f_a$ of finger f is angled at a few degrees, typically 3°-4°, from the normal to the flat surface of platen P. This provides a good contact with the semicircular edge of a typical wafer and provides a small component of the force of finger f pressing against wafer W normal to platen P, which also tends to hold wafer W on platen P. In the embodiment shown in FIG. 8, the inside face $f_a$ is also curved (in a plane perpendicular to the plane of FIG. 8) to match the curved circumferential edge of the wafer, thus spreading the load and reducing stress on the wafer. Finger f is also slightly tapered to reduce mass. In one embodiment (not shown) the inside surface $f_a$ is coated with Teflon ® or other suitable material to prevent wafer W from contacting the metal of finger f, thus reducing particle generation and improving the grip of finger f.

Figure 9:
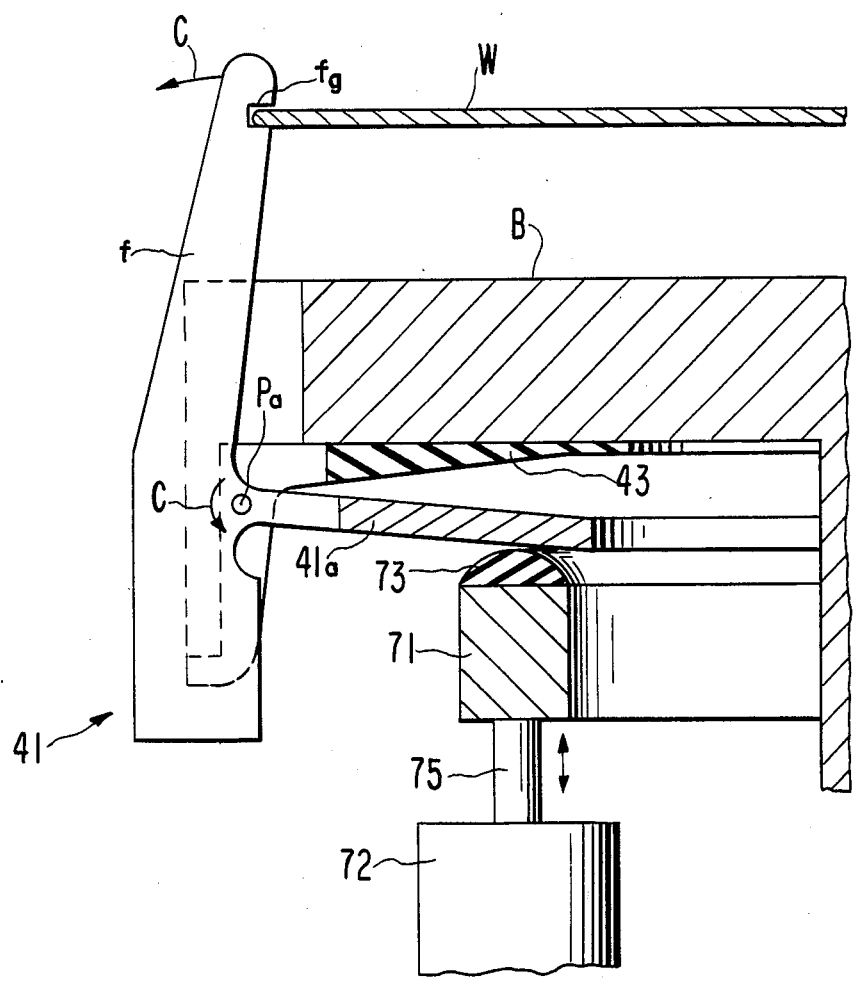
FIG. 9 shows another embodiment of the invention for releaseably holding a workpiece.

FIG. 9 shows another embodiment of the invention suitable for use in a device which is not part of a rotating system. In the embodiment of FIG. 9, collet 41 is attached to base B in the same way that collet 41 is attached to platen P in FIG. 8. Wafer W in FIG. 9 is supported by notches $f_g$ in fingers f and does not contact base B. Fingers f are moved to an open position by air cylinder 72 (or other suitable driving means) which drives a plurality of prongs 75 against annular ring 71. Elastomeric ring 73 is molded on ring 71 and elastically deforms resilient portion 41a of collet 41 when air cylinder 72 drives prongs 75 and ring 71 upward The apparatus described above for releaseably retaining a wafer on a platen has several other advantages over prior art clamping devices.

No surface area of the wafer W is contacted by the wafer retaining apparatus, so that all of the surface area of the wafer is available for the production of semiconductor devices.

Since the wafer is lowered vertically onto the platen and then held there by the retaining fingers, wafer sliding against the platen, which may cause contamination by generating particulates, is virtually eliminated. None of the moving parts of the apparatus slide or rub against the wafer.

All metal parts of the wafer retaining apparatus snap together by means of elastomeric interfaces, eliminating metal to metal contact, which generates particles, and also eliminating metal fasteners such as screws. In general, assuming at least 3 fingers contacting the wafer along an arc greater than 180°, the sum of the forces on the wafer exerted by the fingers (and vice-versa) is independent of the number of fingers contacting the edge of the wafer. Thus, by increasing the number of fingers, the force exerted by each finger on the wafer is reduced, which reduces wafer breakage. If a finger is positioned opposite a wafer flat, the holding device remains in equilibrium.

Finally, the design is intrinsically safe. Wafer W will be retained on the rotating platens for the duration of the implant process even if the spring portion of the collet breaks or if the counterweight ring 53 is no longer retained by elastomeric projections 57.

The above embodiments are intended to be exemplary and not limiting, and in view of the above disclosure, many modifications and substitutions will be obvious to one of average skill without departing from the scope of the invention. For example, while the resilient member 41a in FIGS. 8 and 9 is in the shape of a continuous generally annular ring angled slightly downward from outer edge to inner edge, in other embodiments the resilient member may be given other shapes to better accomodate the shape of the workpiece. For example, the resilient member 41a may be an oval loop or square loop. In the embodiment shown, the resilient member 41 forms a simple closed loop; but if desired, the resilient member may comprise more than one disjoint resilient section, each section connecting a plurality of fingers, with a separate means for selectively elastically deforming each resilient section to move the fingers attached thereto into and out of engagement with a workpiece It should also be clear that the invention may be used for releaseably retaining any workpiece and that the workpiece need not be shaped like a disk. The invention may also be employed to retain wafers in conjunction with many different semiconductor processes in addition to ion implantation.

What is claimed is:

1. A device for releasably holding a workpiece, said device comprising:
   a base;
   a resilient member having a plurality of finger members extending therefrom, said resilient member extending between and connected to said finger members, said resilient member being pivotally attached to said base; and
   means for selectively moving said finger members into and out of engagement with said workpiece, and means for moving including means for elastically deforming said resilient member to pivot said finger members.

2. A device as in claim 1 wherein said resilient member is pivotally attached to said base by portions of said resilient member connecting said finger members, elastic deformation of said resilient member by said means for deforming causing said finger members to pivot.

3. A device as in claim 1 wherein said finger members are coated with a material selected to reduce particle generation or to improve the grip of said finger members.

4. A device as in claim wherein said resilient member is a simple closed loop.

5. A device as in claim 4 wherein said simple closed loop comprises a concial ring.

6. A device as in claim 4 wherein said simple closed loop comprises a generally annular ring.

7. A device as in claim 1 or claim 2 wherein said base comprises means for supporting said workpiece.

8. A device as in claim 7 wherein said means for supporting said workpiece comprises a platen having a flat surface for contacting a flat surface of said workpiece.

9. A device as in claim 8 wherein said finger members have an inner surface for contacting said workpiece inclined a few degrees relative to the normal to said flat surface or said platen when said finger members are in a closed position.

10. A device as in claim 9 wherein a portion of said inner surface is curved.

11. A device as in claim 8 wherein said finger members are dimensioned so that any line extending perpendicularly from said flat surface of said platen does not intersect said finger members.

12. A device as in claim 11 wherein said finger members are adapted for releasably holding a semiconductor wafer and are dimensioned relative to said semiconductor wafer so that said finger members do not extend above the top surface of said flat surface of said platen by more than the thickness of said semiconductor wafer.

13. A device as in claim 8 wherein said platen possesses a plurality of openings extending from the surface of said platen through said platen and further including means for extending a corresponding plurality of lifting members through said opening above said flat surface for lifting said semiconductor wafer from said platen and for retracting said plurality of said lifting members through said openings to a position beneath said surface for lowering a semiconductor onto said platen.

14. A device as in claim 2 wherein said means for elastically deforming comprises means for pressing against said resilient member.

15. A device as in claim 14 wherein said means for pressing comprises an actuating and means for driving said actuating member against said resilient member.

16. A device for releaseably holding a workpiece, said device comprising:
 a base;
 a resilient member having a plurality of finger members extending therefrom said resilient member extending between and connected to said finger members;
 means for pivotally attaching said resilient member to said base; and
 means for elastically deforming said resilient member to pivot said finger members from a first position to a second position, said finger members being positioned for engaging said workpiece in one of said first and said second positions.

17. A device as in claim 16 wherein said means for pivotally attaching comprises an elastomeric member positioned between said base and said resilient member.

18. A device as in claim 17 wherein said elastomeric member is attached to said base.

19. A device as in claim 18 wherein said elastomeric member possesses an indentation for receiving a portion of said resilient member.

20. A device as in claim 19 wherein said resilient member has the form of a simple closed loop and said portion comprises a part of said resilient member between said finger members.

21. A device as in claim 16 further comprises a counterweight member attached to said resilient member, said counterweight member being selected to counterbalance the pivoting moment generated by a workpiece held by said device when said device is being rotated.

22. A device as in claim 16 wherein said base comprises a platen for contacting and supporting a flat workpiece.

23. A device for releasably retaining a flat surface of a semiconductor wafer in contact with a flat surface of a platen having a central axis normal to the flat surface of said platen, said device comprising:
 a platen having a flat surface;
 a plurality of finger members with a resilient member extending between and connected to said finger members.
 means for attaching said finger members to said platen so that a portion of each of said finger members extends above the flat surface of said platen and for moving said finger members from a closed position to an open position, said portions of said finger members being closer to said central axis in said closed position than in said open position, said finger members being dimensioned so that in said closed position said finger members do not extend above the flat surface of said platen by more than the thickness of said semiconductor wafer.

24. A batch processing apparatus comprising:
 a plurality of devices, each being a device defined in claim 2, 16, or 21;
 means for supporting said devices at a fixed distance from an axis; and
 means for rotating said means for supporting about said axis.

25. A batch processing apparatus as in claim 24 wherein said means for supporting said plurality of said devices comprises a disk.

26. A batch processing apparatus as in claim 24 further includes means for rotating said means for supporting about a second axis perpendicular to said first axis.

* * * * *